(12) United States Patent
Gruber et al.

(10) Patent No.: US 6,489,675 B1
(45) Date of Patent: Dec. 3, 2002

(54) OPTICAL SEMICONDUCTOR COMPONENT WITH AN OPTICALLY TRANSPARENT PROTECTIVE LAYER

(75) Inventors: Martin Gruber, Schwandorf (DE); Gernot Althammer, Wörth/Do (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/549,094

(22) Filed: Apr. 13, 2000

(30) Foreign Application Priority Data

Apr. 13, 1999 (DE) .......................... 199 16 572

(51) Int. Cl.⁷ .............................................. H01L 23/04
(52) U.S. Cl. ...................... 257/698; 257/749; 257/774; 257/773; 257/780; 257/276
(58) Field of Search ................. 257/698, 749, 257/774, 773, 780, 276

(56) References Cited

U.S. PATENT DOCUMENTS

| | | | |
|---|---|---|---|
| 3,622,419 A | | 11/1971 | London |
| 3,787,252 A | * | 1/1974 | Filippazzi et al. ........... 148/175 |
| 4,761,681 A | | 8/1988 | Reid |
| 5,521,992 A | * | 5/1996 | Chun et al. .................... 385/14 |
| 5,528,080 A | | 6/1996 | Goldstein |
| 5,608,264 A | | 3/1997 | Gaul |
| 5,922,550 A | * | 7/1999 | Everhart et al. ............ 435/7.21 |
| 5,973,396 A | * | 10/1999 | Farnworth ................... 257/698 |
| 6,160,834 A | * | 12/2000 | Scott ............................. 372/96 |

FOREIGN PATENT DOCUMENTS

DE 35 38 986 A1 5/1987

OTHER PUBLICATIONS

John Baliga: "Flip–Chip Packaging: Prepare for the Ramp–Up", Semiconductor International, Mar. 1998, pp. 87–93.
Richard H. Livengood et al.: "FIB Techniques to Debug Flip–Chip Integrated Circuits", Semiconductor International, Mar. 1998, pp. 111–116.
"ShellCase Ultrathin Chip Size Package", ShellCase Wafer Scale Packaging Technical Notes, http://www.shellcase.co.il/ultra.html, pp. 1–5.
"A CSP Optoelectronic Package for Imaging and Light Detection Applications", A. Badihi, Jun. 1996, http://www.shellcase.co.il/csp.html, pp. 1–3.

* cited by examiner

Primary Examiner—David L. Talbott
Assistant Examiner—Luan Thai
(74) Attorney, Agent, or Firm—Laurence A. Greenberg; Werner H. Stemer; Gregory L. Mayback

(57) ABSTRACT

The optical semiconductor component has a semiconductor body having a first surface with an active region and a second surface with a passive region. An optically transparent layer adjoins at least the optically active region. Conduction paths extend from the active region through the semiconductor body to contact-making points in the region of the second surface.

11 Claims, 1 Drawing Sheet

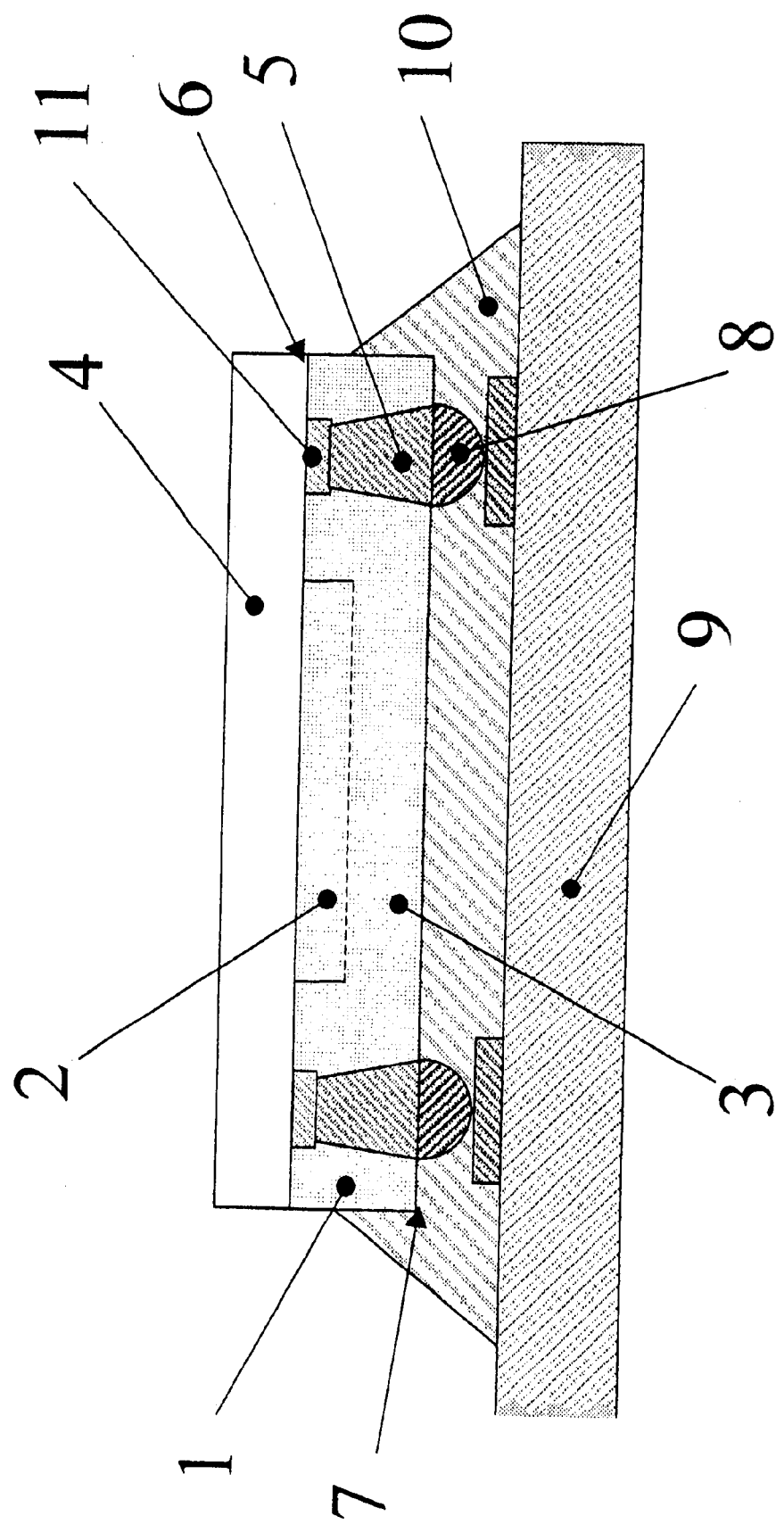

OPTICAL SEMICONDUCTOR COMPONENT WITH AN OPTICALLY TRANSPARENT PROTECTIVE LAYER

BACKGROUND OF THE INVENTION

Field of the Invention

The present invention relates to an optical semiconductor component having an optically transparent protective layer. The semiconductor component has a semiconductor body, which has an active region in the region of a first surface and a passive region in the region of a second surface. Such optical semiconductor components are known, in principle, from the prior art. See, for example, A. Badihi, "A CSP Optoelectronic Package For Imaging And Light Detection Applications", June 1996, http://www.shellcase.co.il/techframe.html. The optical components are used, for example, in optical sensors, LEDs, laser diodes, photodiodes, or memory devices that can be influenced optically.

In order to be able to prevent such semiconductor components from being destroyed, it is necessary to ensure that the component is protected against harmful external influences. A customary measure for this purpose is to package the semiconductor component in a housing, the housing having an optically transparent region which guarantees transmissivity for optical radiation. As a rule, there is a cavity situated between this transparent region and the semiconductor body, that is to say this housing region is arranged at a certain distance from the optically active region of the semiconductor component. However, such housings considerably enlarge the dimensions of these optical semiconductor components and thus impede more extensive miniaturization of the semiconductor components. Such miniaturization is important, for example, in the context of mobile telecommunications equipment, cameras or similar areas of application which require the smallest possible structural elements. On the other hand, the customary methods used for making contact with optical semiconductor components also constitute an impediment to more extensive miniaturization of these components.

SUMMARY OF THE INVENTION

The object of the invention is to provide an optical semiconductor element with optically transparent protective layer which overcomes the above-noted deficiencies and disadvantages of the prior art devices and methods of this kind, and which allows the most extensive miniaturization possible.

With the above and other objects in view there is provided, in accordance with the invention, an optical semiconductor component, comprising: a semiconductor body having a first surface with an optically active region and a second surface with a passive region; an optically transparent layer adjoining the optically active region; and conduction paths extending from the active region through the semiconductor body to contact-making points at the second surface.

In other words, the novel optical semiconductor component has an optically transparent layer arranged in such a way that it directly adjoins at least the optically active region of the component. Consequently, the smallest possible distance between the transparent layer, which is designed as a protective layer for the semiconductor component, and the active region of the semiconductor component is guaranteed. The smallest possible structural height of the semiconductor component is thus obtained. The transparent layer may thereby cover only the active region of the semiconductor body, but it ideally covers the entire first surface of the semiconductor body, the active region of the component being arranged in the region of the first surface. Consequently, the entire first surface can be protected against harmful effects.

In accordance with an added feature of the invention, the transparent layer is a glass plate attached to the first surface with a transparent adhesive.

In accordance with an additional feature of the invention, the transparent layer is a plastic coating layer deposited onto the first surface or a plastic layer bonded to the first surface.

In other words, the transparent layer may be composed for example of a glass plate, e.g. of quartz glass, where the glass plate can be fixed on the first surface by means of a transparent adhesive. However, it is also possible to provide a transparent layer made of plastic, which is likewise fixed on the first surface by a transparent adhesive, or the transparent plastic layer is deposited directly onto the first surface, for example by spray application and curing, so that an adhering bond between the transparent layer and the first surface is automatically produced. A transparent adhesive can be dispensed with in this latter case.

In accordance with another feature of the invention, the semiconductor body is formed with openings each lined with a metal body, and the conduction paths extend through the openings. The metal body may be formed from a metal layer of aluminum or copper. In the alternative, the metal body is a tungsten plug.

According to the invention, in the case of the optical semiconductor component it is furthermore provided that conduction paths extend from the active region through the semiconductor body to contact-making points in the region of the second surface of the semiconductor component. Any contact arrangements projecting laterally beyond the dimensions of the semiconductor body can thus be dispensed with. The extent of the semiconductor body together with its contact arrangement is thus limited to the dimensions of the semiconductor body itself. Consequently, the width of the semiconductor component can also be reduced to the largest possible degree.

In this case, it may be provided that the conduction paths extend through openings in the semiconductor body from the first to the second surface, these openings each being lined with a metal body. By way of example, said metal body may be formed by a metal layer, e.g. made of aluminum or copper, where the metal layer either only covers the insides of the openings or fills the entire opening. However, it may also be provided that the metal body is formed by a metal plug, e.g. made of tungsten.

The openings in the semiconductor body can be produced by a laser, for example, preferably proceeding from the rear side of the semiconductor body. Such a method is known, in principle, from R. H. Livengood, V. R. Rao, "FIB Techniques to Debug Flip-Chip Integrated Circuits", March 1998, Semiconductor International, p. 111–16.

In accordance with a further feature of the invention, the conduction paths are formed of doped semiconductor regions in the semiconductor body extending from the first surface to the second surface. The doped semiconductor regions may be formed by implantation. In an alternative embodiment, the doped semiconductor regions may be trenches filled with doped semiconductor material, the trenches extending from the first surface to the second surface.

As noted, the doped semiconductor regions can be formed for example by the implantation of doping material into the semiconductor body. However, it may also be provided that trenches are patterned into the semiconductor body, which trenches are filled with a doped semiconductor material. In order to accelerate this method, it may be provided, for example, that first of all only doped semiconductor regions which extend from the first surface into the semiconductor body to a certain depth are produced. The semiconductor body is subsequently ground starting from the second surface until the doped regions are reached and thus come through to the surface. Consequently, it is no longer necessary to provide for continuous implantation or patterning of trenches through the entire semiconductor body.

In accordance with a concomitant feature of the invention, the conduction paths terminate in conductive elevations projecting above the second surface and forming contact-making points at the second surface. In other words, the conduction paths end in conductive elevations, so-called "bumps", in the region of the second surface. These elevations are elevated above the second surface and thus form protruding contact-making points. The optical semiconductor component can then be connected to an intermediate carrier or a circuit board via these contact-making points.

Other features which are considered as characteristic for the invention are set forth in the appended claims.

Although the invention is illustrated and described herein as embodied in an optical semiconductor component having an optically transparent protective layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE shows an optical semiconductor component with a transparent protective layer on the semiconductor body and conduction paths through the semiconductor body.

DESCRIPTION OF THE PREFERRED EMBODIMENT

With reference to the drawing FIGURE, the optical semiconductor component has a semiconductor body 1, which has an active region 2 in or at its first surface 6 (front surface) and a passive region 3 at its second surface 7 (rear surface) on the rear side. A transparent protective layer 4, for example made of quartz glass or plastic, is applied to the entire first surface 6. This layer may either be fixed by a transparent adhesive, or, in the case of a plastic layer, have been coated by spray application onto the surface.

The conductive connection between the active region 2 and an intermediate carrier or a circuit board 9 is established by conduction paths 5 extending through the semiconductor body 1.

Short conduction routes are thereby provided from the active region 2 to contact-making points 11 in the region of the first surface 6. A conductive connector 5 extends from these contact-making points 11 through the semiconductor body 1 as far as elevations 8 on the rear side 7 of the semiconductor body. There, the elevations 8 form contact-making points to the circuit board or to the intermediate carrier 9. A mechanical supplementary fixing 10—a so-called lower filling —may optionally be provided under the semiconductor component in order to increase the stability of the component on the circuit board or the intermediate carrier 9.

The conduction paths 5 in the semiconductor body 1 are composed either of metal or of a doped semiconductor region. The doped semiconductor regions may be formed by implantation or the filling of trenches, if appropriate followed by grounding of the semiconductor body. If metallic conduction paths are provided, then openings can be formed through the semiconductor body by means of a laser, starting from the second surface 7 of the semiconductor body. The semiconductor body is subsequently metalized starting from the second surface 7, the openings being lined with a metal layer or being completely filled with metal. The elevations 8 are subsequently formed on the metal body in the openings, as a result of which contact-making points for making contact with the intermediate carrier or the circuit board 9 are formed.

The present invention provides an optical semiconductor component which can be reduced to its smallest possible dimensions. Furthermore, all steps for fabricating the component can be produced directly on the semiconductor wafer. Consequently, further processing steps for housing assembly are not necessary, which significantly simplifies the fabrication of such components.

We claim:

1. An optical semiconductor component, comprising:
   a semiconductor body having a first surface with an optically active region and a second surface with a passive region;
   an optically transparent protective layer directly adjoining said optically active region and covering all of said first surface; and
   conduction paths extending from said active region through said semiconductor body to contact-making points at said second surface.

2. The optical semiconductor component according to claim 1, wherein said layer is a glass plate attached to said first surface with a transparent adhesive.

3. The optical semiconductor component according to claim 1, wherein said layer is a plastic coating layer deposited onto said first surface.

4. The optical semiconductor component according to claim 1, wherein said layer is a plastic layer bonded to said first surface.

5. The optical semiconductor component according to claim 1, wherein said semiconductor body is formed with openings each lined with a metal body, and said conduction paths extend through said openings.

6. The optical semiconductor component according to claim 5, wherein said metal body is formed from a metal layer selected from the group consisting of aluminum and copper.

7. The optical semiconductor component according to claim 5, wherein said metal body is a tungsten plug.

8. The optical semiconductor component according to claim 1, wherein said conduction paths are formed of doped semiconductor regions in the semiconductor body extending from said first surface to said second surface.

9. The optical semiconductor component according to claim 8, wherein said doped semiconductor regions are semiconductor regions with implanted dopants.

10. The optical semiconductor component according to claim 8, wherein said doped semiconductor regions are trenches filled with doped semiconductor material, said trenches extending from said first surface to said second surface.

11. The optical semiconductor component according to claim 1, wherein said conduction paths terminate in conductive elevations projecting above said second surface and forming contact-making points at said second surface.

* * * * *